(12) United States Patent
Werkman et al.

(10) Patent No.: US 7,969,577 B2
(45) Date of Patent: Jun. 28, 2011

(54) INSPECTION APPARATUS, AN APPARATUS FOR PROJECTING AN IMAGE AND A METHOD OF MEASURING A PROPERTY OF A SUBSTRATE

(75) Inventors: Roy Werkman, Waalre (NL); Everhardus Cornelis Mos, Best (NL); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 133 days.

(21) Appl. No.: 11/520,790

(22) Filed: Sep. 14, 2006

(65) Prior Publication Data

US 2008/0068609 A1    Mar. 20, 2008

(51) Int. Cl.
*G01N 21/55* (2006.01)
(52) U.S. Cl. ...................................................... 356/445
(58) Field of Classification Search .... 356/237.2–237.5, 356/445–446
See application file for complete search history.

(56) References Cited

U.S. PATENT DOCUMENTS

| | | | |
|---|---|---|---|
| 5,076,687 A * | 12/1991 | Adelson | 356/4.04 |
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 5,991,083 A * | 11/1999 | Shirochi | 359/618 |
| 6,133,986 A * | 10/2000 | Johnson | 355/67 |
| 6,486,952 B2 * | 11/2002 | Takeuchi | 356/369 |
| 6,566,896 B2 * | 5/2003 | Takeuchi | 324/750 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |

(Continued)

FOREIGN PATENT DOCUMENTS

JP    2006-060214 A    3/2006

(Continued)

OTHER PUBLICATIONS

Notice of Reasons for Rejection mailed Aug. 13, 2010 for Japanese Patent Application No. 2007-232149, 3 pgs.

(Continued)

*Primary Examiner* — Tarifur R. Chowdhury
*Assistant Examiner* — Isiaka O Akanbi
(74) *Attorney, Agent, or Firm* — Sterne, Kessler, Goldstein & Fox P.L.L.C.

(57) ABSTRACT

When using a scatterometer different portions of a target area may be at different focal depths. When the whole area is measured this results in part of it being out of focus. To compensate for this an array of lenses is placed in the back focal plane of the high numerical aperture lens.

11 Claims, 6 Drawing Sheets

U.S. PATENT DOCUMENTS

| | | | |
|---|---|---|---|
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 7,072,034 B2 * | 7/2006 | Rosengaus et al. | 356/237.5 |
| 7,223,232 B2 * | 5/2007 | Mizuno | 600/160 |
| 7,433,038 B2 * | 10/2008 | Bijnen et al. | 356/400 |
| 7,620,309 B2 * | 11/2009 | Georgiev | 396/113 |
| 7,791,727 B2 | 9/2010 | Den Boef et al. | |
| 2003/0085335 A1 * | 5/2003 | Almogy et al. | 250/208.1 |
| 2004/0061042 A1 * | 4/2004 | Almogy et al. | 250/208.1 |
| 2004/0119970 A1 | 6/2004 | Dusa et al. | 356/237.1 |
| 2004/0147810 A1 * | 7/2004 | Mizuno | 600/178 |
| 2004/0165189 A1 * | 8/2004 | Castonguay | 356/446 |
| 2006/0033921 A1 | 2/2006 | Den Boef et al. | 356/446 |
| 2006/0066855 A1 | 3/2006 | Den Boef et al. | 356/401 |
| 2006/0126074 A1 | 6/2006 | Van Der Werf et al. | 356/489 |
| 2006/0139592 A1 | 6/2006 | Den Boef et al. | 355/53 |
| 2006/0244941 A1 * | 11/2006 | Gruner et al. | 355/69 |
| 2007/0081163 A1 * | 4/2007 | Liang et al. | 356/445 |

FOREIGN PATENT DOCUMENTS

WO    WO 2004/076993 A2    9/2004

OTHER PUBLICATIONS

Ren Ng, et al., "Light Field Photography with a Hand-Held Plenoptic Camera," Stanford University Computer Science Tech Report CTSR 2005-02, Computer Science Department, Stanford University, Apr. 2005, pp. 1-11, URL: http://graphics.stanford.edu/papers/lfcamera/lfcamera-150dpi.pdf.

Kazuya Kodama, "Study on Image Generation based on Integrated Conversion Process of a Group of Multiple Focusing Images", Image Media Processing Symposium, Material from the 8$^{th}$ Symposium, Japan, Nov. 14, 2003, pp. 73-74.

Kazuya Kodama, et al., "Generation of Various Images Using Multiple Differently Focused Images," Journal of the Institute of Image Information and Television Engineers, Japan, Mar. 20, 2000, vol. 54, Issue No. 3, pp. 426-430.

* cited by examiner

INSPECTION APPARATUS, AN APPARATUS FOR PROJECTING AN IMAGE AND A METHOD OF MEASURING A PROPERTY OF A SUBSTRATE

BACKGROUND OF THE INVENTION

1. Field of the Invention

The present invention relates to methods of inspection usable, for example, in the manufacture of devices by lithographic techniques and to methods of manufacturing devices using lithographic techniques.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to determine features of the substrate, such as its alignment, a beam is reflected off the surface of the substrate, for example at an alignment target, and an image is created on a camera of the reflected beam. By comparing the properties of the beam before and after it has been reflected off the substrate, the properties of the substrate can be determined. This can be done, for example, by comparing the reflected beam with data stored in a library of known measurements associated with known substrate properties.

Such a system of illuminating a target and collecting data from the reflected radiation is often used to illuminate a plurality of superimposed patterns. The second pattern has a predetermined bias compared to the first pattern. By analyzing the characteristics of the reflected radiation, it is possible to determine the overlay error, OV, between the gratings. A cross-section of a substrate with superimposed patterns is shown in accompanying FIG. 7. As can be seen, the exposed patterns 80, 81 are separated by a vertical height, Z, and are thus at different focal depths. It can therefore be difficult to focus on both patterns simultaneously. Consequently one of the gratings is often out of focus and a poor image results. One method of improving the focus is to increase the depth of the focus, but this decreases the amount of light detected and thus the image quality. There is therefore a trade-off between signal strength and focus depth. Furthermore, no depth information about the object is collected. An alternative method of detecting accurate images of both patterns would be to perform two measurements: one focused on each of the patterns, but this causes a significant loss in productivity.

SUMMARY OF THE INVENTION

It is desirable to provide an apparatus which can provide improved image quality at a plurality of depths of focus.

According to an embodiment of the invention, an inspection apparatus configured to measure a property of the substrate comprises a radiation projector configured to project radiation onto the substrate; a detector configured to detect a radiation beam reflected from a surface of the substrate; and an array of lenses, each lens configured to project a portion of the reflected radiation beam onto the detector.

According to another embodiment of the invention, a method of measuring a property of a substrate comprises projecting radiation onto a substrate using a radiation projector; projecting the radiation reflected from the substrate through an array of lenses, each lens configured to project a different portion of the reflected radiation; and detecting the reflected radiation projected through the array of lenses, the reflected radiation being indicative of the properties to be measured.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
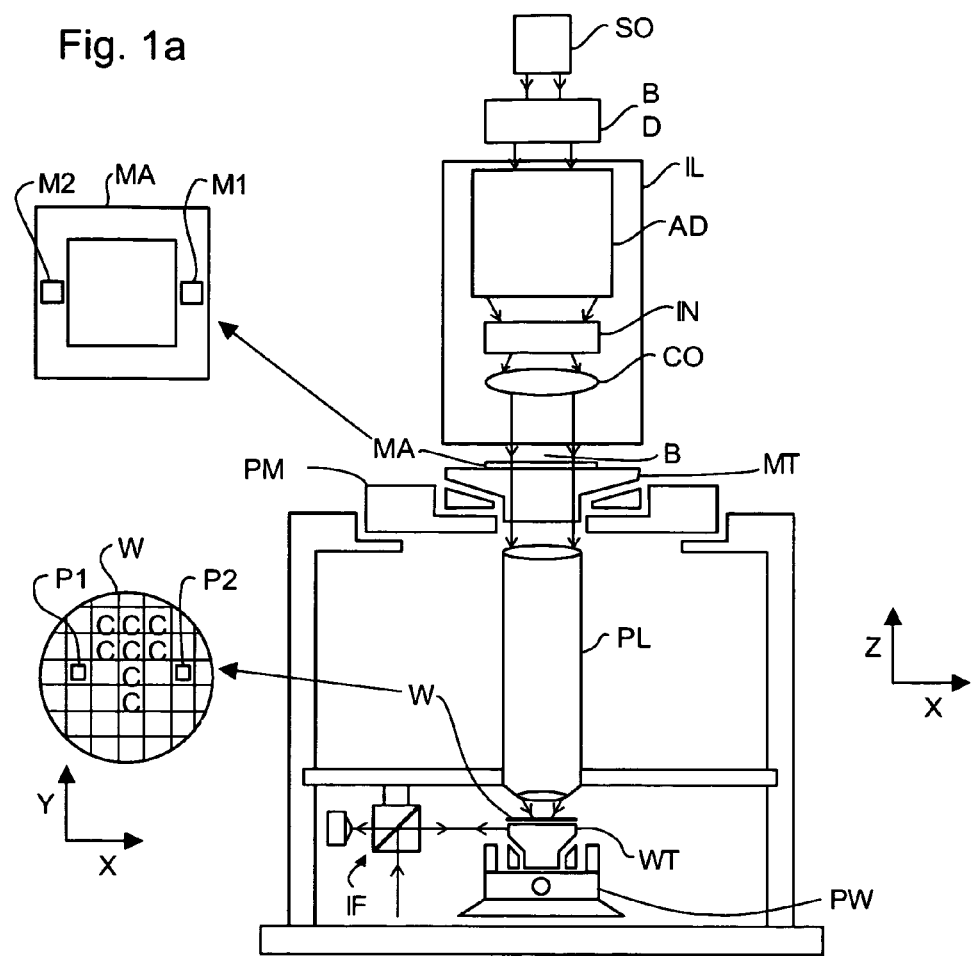
FIG. 1a depicts a lithographic apparatus.

FIG. 1a schematically depicts a lithographic apparatus. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PL is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
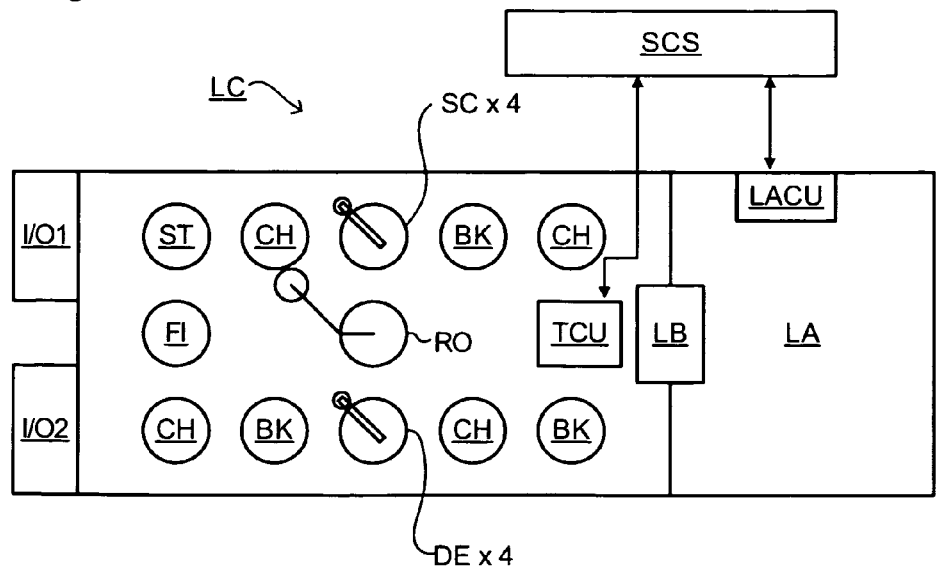
FIG. 1b depicts a lithographic cell or cluster.

As shown in FIG. 1b, the lithographic apparatus LA forms part of a lithographic cell LC, also sometimes referred to as a lithocell (lithographic cell) or cluster, which also includes apparatus to perform pre- and post-exposure processes on a substrate. Conventionally, these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers them to the loading bay LB of the lithographic apparatus. These devices, which are often collectively referred to as the track, are under the control of a track control unit TCU, which is itself controlled by the supervisory control system SCS, which also controls the lithographic apparatus. Thus, the different apparatus can be operated to maximize throughput and processing efficiency.

In order that the substrates that are exposed by the lithographic apparatus are exposed consistently for each layer of resist, there are certain properties of the substrate that need to be measured to determine whether there are changes in alignment, rotation, etc., that must be compensated for by the lithographic apparatus. A separate inspection apparatus is used to determine the properties of the substrates, and in particular, how the properties of different substrates or different layers of the same substrate vary from layer to layer.

Figure 2:
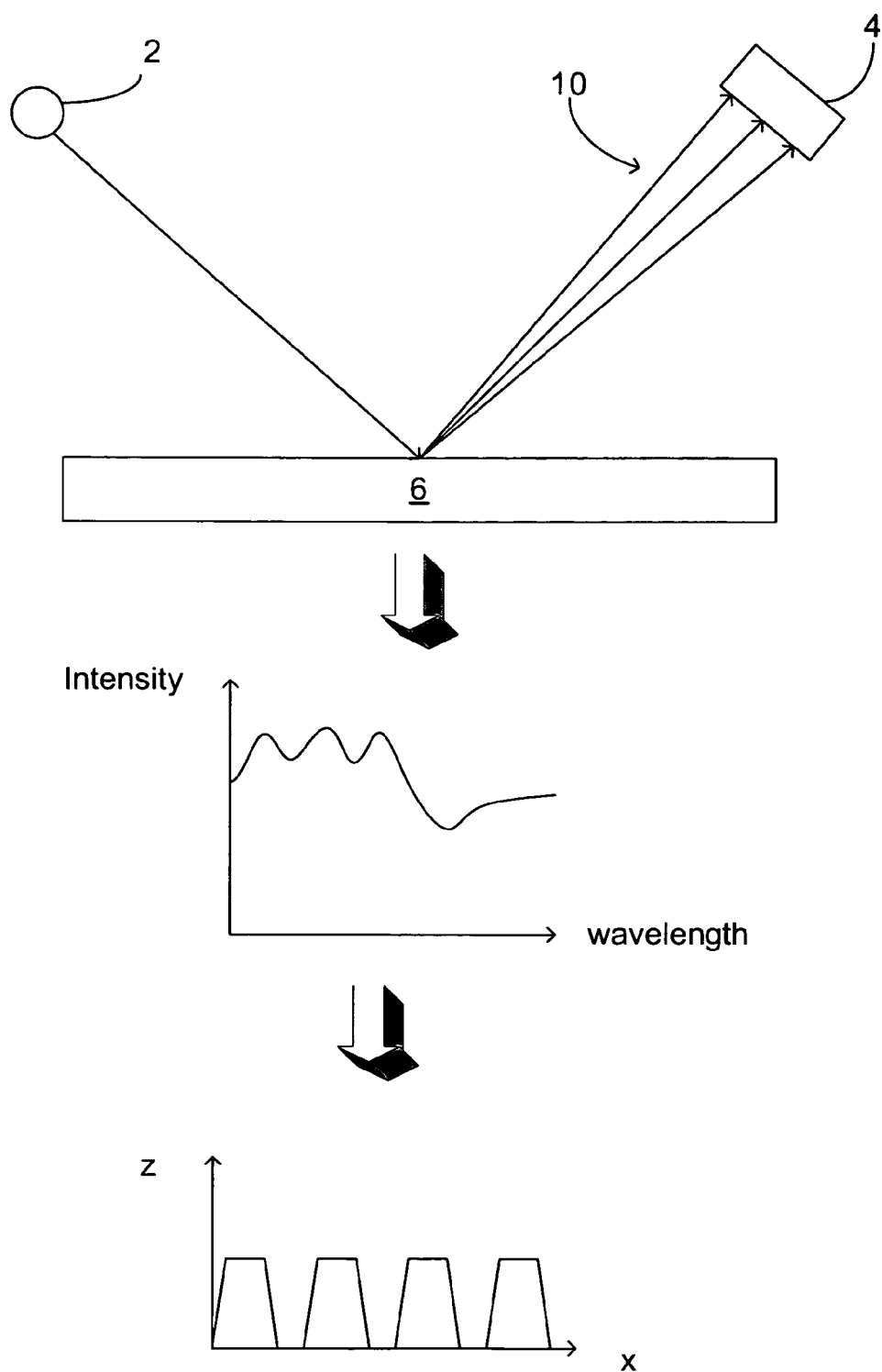
FIG. 2 depicts a scatterometer.

The properties of the surface of a substrate W may be determined using a sensor such as a scatterometer such as that depicted in FIG. 2. The scatterometer comprises a broadband (white light) radiation projector 2, which projects radiation onto a substrate W (shown in FIG. 2 as substrate 6). The reflected radiation is passed to a spectrometer detector 4, which measures a spectrum 10 (intensity as a function of wavelength) of the specular reflected radiation. From this data, the structure or profile giving rise to the detected spectrum may be reconfigured, e.g., by Rigorous Coupled Wave Analysis and non-linear regression, or by comparison with a library of simulated spectra as shown at the bottom of FIG 2. In general, for the reconstruction, the general form of the structure is known and some parameters are assumed from knowledge of the process by which the structure was made, leaving only a few parameters of the structure to be determined from the scatterometry data.

The scatterometer may be a normal-incidence scatterometer or an oblique-incidence scatterometer. Variants of scatterometry may also be used in which the reflection is measured at a range of angles of a single wavelength (or a limited range of wavelengths e.g. 500-510 nm), rather than the reflection at a single angle of a range of wavelengths.

Figure 3:
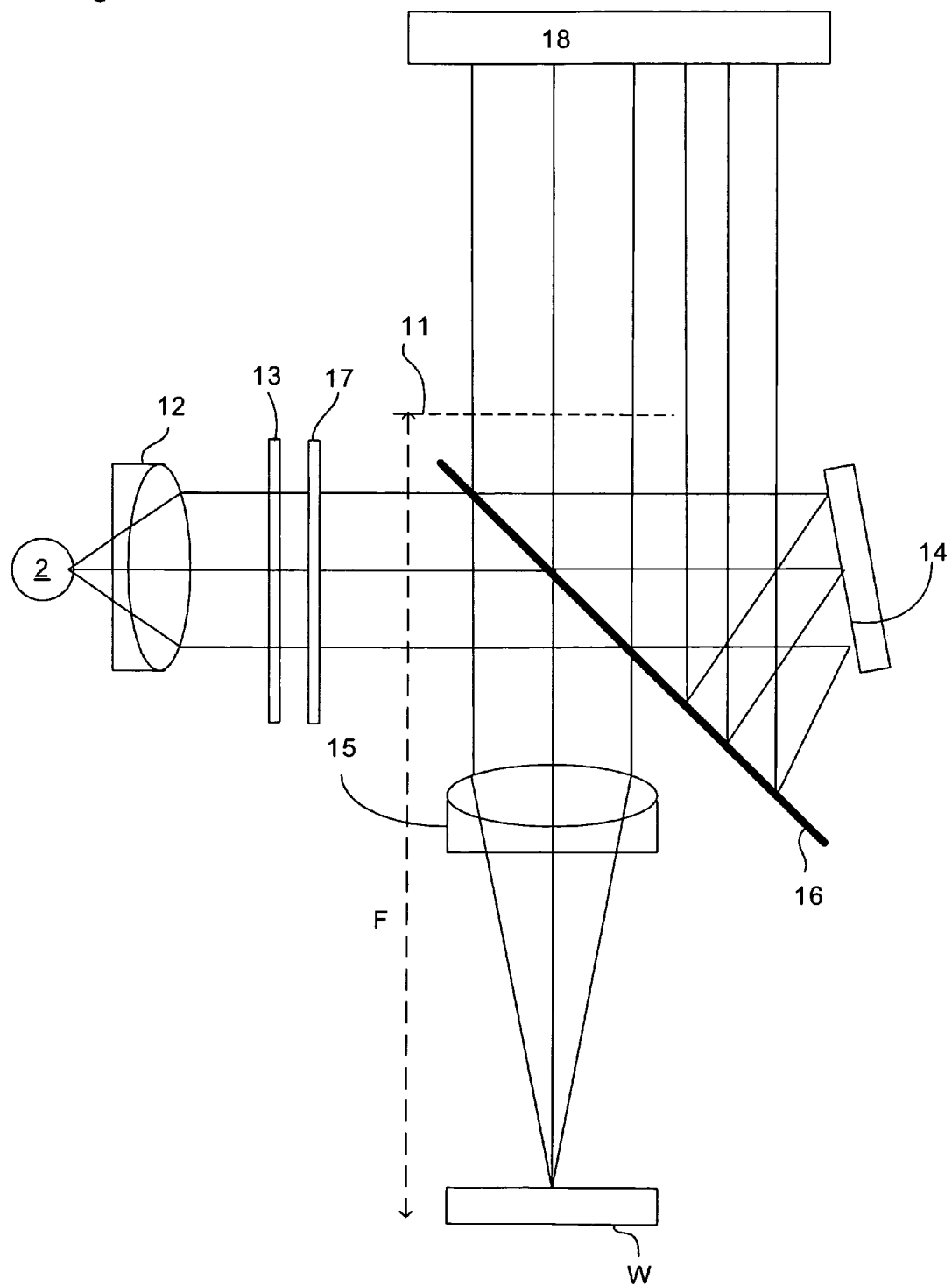
FIG. 3 depicts the general operating principle of measuring an angle resolved spectrum in the pupil plane of a high-NA lens.

Scatterometers for measuring properties of a substrate may measure, in the pupil plane 11 of a high numerical aperture lens, the properties of an angle-resolved spectrum reflected from the substrate surface W at a plurality of angles and wavelengths as shown in FIG. 3. Such a scatterometer may comprise a radiation projector 2 for projecting radiation onto the substrate and a detector 18 for detecting the reflected spectra. The pupil plane is the plane in which the radial position of radiation defines the angle of incidence and the angular position defines azimuth angle of the radiation (and any substantially conjugate plane). The detector 18 is placed in the pupil plane of the high numerical aperture lens. The numerical aperture may be high and preferably at least 0.9 and more preferably at least 0.95. Immersion scatterometers may even have lenses with numerical apertures over 1.

Some angle-resolved scatterometers only measure the intensity of scattered light. However, more recent scatterometers allow several wavelengths to be measured simultaneously at a range of angles. The properties measured by the scatterometer for different wavelengths and angles may be the intensity of transverse magnetic- and transverse electric-polarized light and the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of, say, $\lambda\delta$ and a spacing, therefore, of at least $2\lambda\delta$ (i.e. twice the wavelength). Several "sources" of radiation can be different portions of an extended radiation source which have been split using, say, fiber bundles. In this way, angle resolved scatter spectra can be measured at multiple wavelengths in parallel. A 3-D spectrum (wavelength and two different angles) is measured, which contains more information than a 2-D spectrum. This allows more information to be measured which increases metrology process robustness. This is described in more detail in U.S. Patent Application Publications 2006/00066855 A1 and 2006/0033921 A.

A scatterometer that may be used with the present invention is shown in FIG. 3. The radiation of the radiation projector 2 is focused using lens system 12 through interference filter 13 and polarizer 17, reflected by partially reflected surface 16 and is focused onto substrate W via a microscope objective lens 15. The radiation is then transmitted through partially reflective surface 16 into a detector 18, for example a CCD, in the back projected pupil plane 11 in order to have the scatter spectrum detected. The pupil plane 11 is at the focal length of the lens system 15. A detector and high aperture lens are placed at the pupil plane. The pupil plane may be re-imaged with auxiliary optics since the pupil plane of a high-NA lens is usually located inside the lens.

A reference beam is often used for example to measure the intensity of the incident radiation. When the radiation beam is incident on the beam splitter 16 part of it is transmitted through the beam splitter towards a reference mirror 14. The reference beam is then projected onto a different part of the same detector 18.

The pupil plane of the reflected radiation is imaged on the detector 18 with an integration time of, for example, 40 milliseconds per frame. In this way, a two-dimensional angular scatter spectrum of the substrate targets is imaged on the detector. The detector may be, for example, an array of CCD or CMOS sensors.

A set of interference filters 13 is available to select a wavelength of interest in the range of, for example, 405-790 nm or even lower, such as 200-300 nm. The interference filter may be tunable rather than comprising a set of different filters. A grating could be used instead of interference filters.

The substrate W may be a grating which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process from knowledge of the printing step and/or other scatterometry processes.

Figure 4:
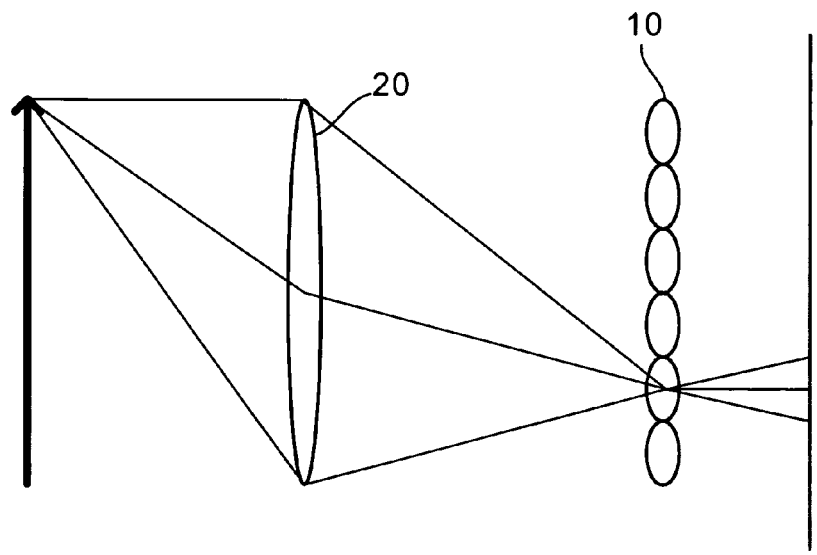
FIG. 4 depicts a plenoptic camera.
Figure 5:
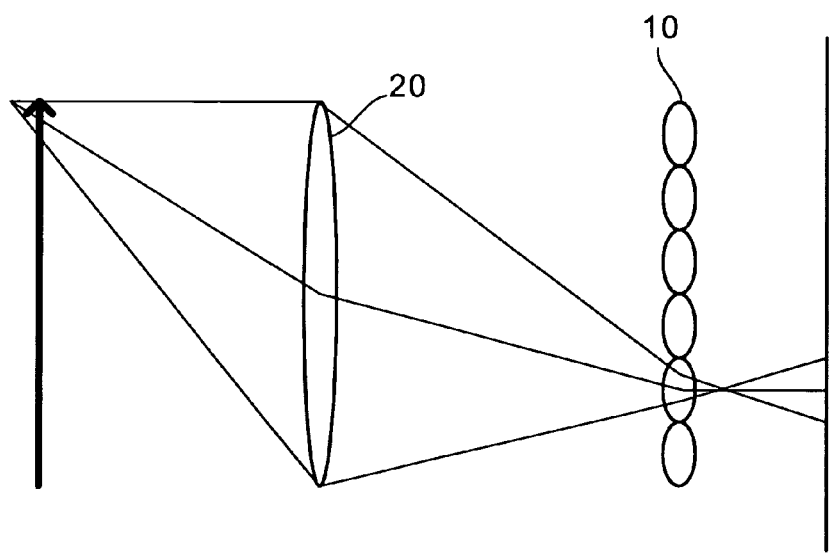
FIG. 5 depicts a plenoptic camera.

This invention uses the principles behind a plenoptic camera so for ease of reference the operation of a plenoptic camera is discussed here in conjunction with FIGS. 4 and 5. A plenoptic camera operates by introducing an array of lenses 10 at the back focal plane of the main lens 20. The individual lenses in the lens array separate the radiation based on direction. If the radiation originates from a single point the image projected onto the detector by a single lens will be substantially uniform. However, if the radiation does not originate from a single point (e.g. because the subject is not in the focal plane of the main lens) the lens element will disperse radiation from a plurality of sources. This scenario is shown in FIG. 5 and the resulting sub-image from a single lens in the array will have some variations. Using the degree of variation across the sub-image and the contrast compared to surrounding sub-images it is therefore possible to detect the focal depth of an object.

Figure 6:
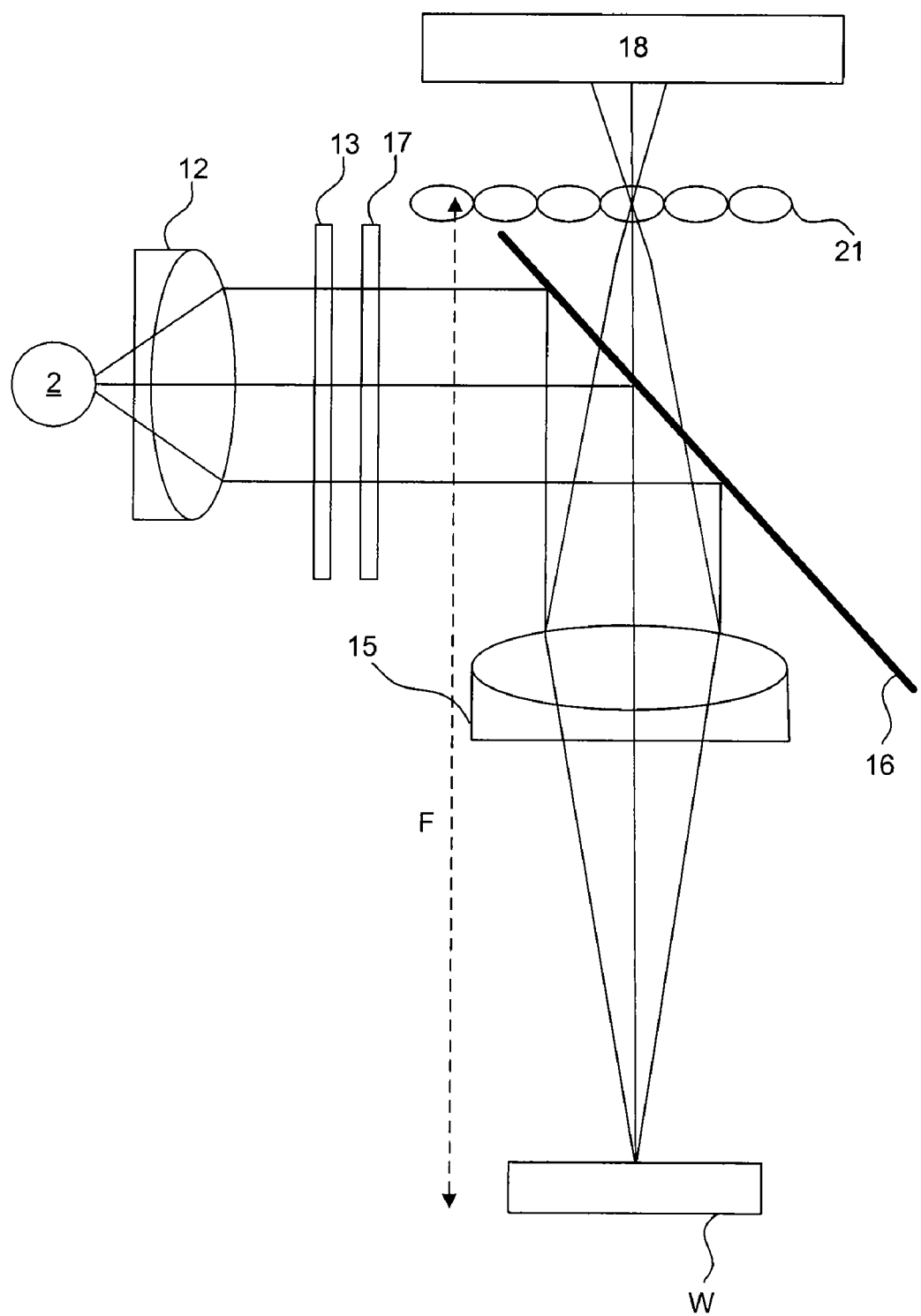
FIG. 6 depicts an apparatus according to the invention.

An apparatus according to the invention is shown in FIG. 6. As can be seen a lens array 21, for example a microlens array has been positioned in the pupil plane of the high numerical aperture lens 15 and in front of the detector 18, for example a CCD detector. The lens array causes the apparatus to operate as a plenoptic camera and radiation from a single point on the substrate (or a plurality of points on the substrate if it is out of focus) is separated by each lens in the lens array to generate a sub-image. The cross-section of a sub-image can be analyzed to determine how uniform the cross-section of each image is. If it is not uniform the substrate is out of focus.

If the substrate is found to be out of focus at a particular point a mathematical calculation can be performed to calculate the amount by which the substrate is out of focus. This can be used to refocus the substrate at the correct focal depth for a particular point on the substrate or preferably to perform a mathematical correction to calculate the image of the point at the correct focal depth. Thus the image of a particular point at the correct focal depth can be computed.

A data handling unit can be used to analyze these sub-images which can then be put together to form a large image of the target area of the substrate W.

Figure 7:
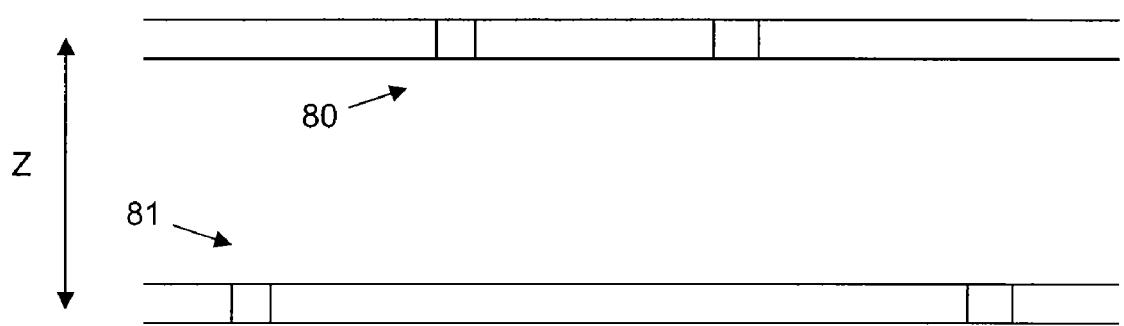
FIG. 7 depicts two superimposed patterns.

If, for example, different areas of the target shown in FIG. 7 are at different focal depths, these can all be successfully focused. There is therefore less sensitivity to focus differences between targets, and it is possible to obtain a larger focus depth without reducing the signal strength. Consequently, it is no longer necessary to perform measurements at a plurality of depths, and the focal depth at each point is known. Furthermore, because the apparatus is less sensitive to focus depth, less time and effort is needed to obtain the correct focus.

What is claimed is:

1. A method of measuring focal depth properties of a substrate, comprising:
    projecting a radiation beam onto a substrate;
    projecting the radiation beam reflected from the substrate through an array of lenses located at a pupil plane of an objective lens, each lens configured to project a different portion of the reflected radiation beam;
    detecting the reflected radiation beam portions projected through the array of lenses and an angle resolved spectrum of radiation projected by each lens in the array of lenses, adjacent the detector, the reflected radiation beam portions being indicative of the focal depth properties to be measured and reconstructing a simulated surface of the substrate based on a comparison of the angle resolved spectrum with a library of simulated spectra; and
    analyzing the focal depth properties to determine focus corrections of particular points on the substrate.

2. The method according to claim 1, wherein the focal depth properties to be measured include overlay error.

3. The method of claim 1, further comprising processing the angle resolved spectrum projected by each lens to generate a single angle resolved spectrum.

4. The method of claim 1, further comprising detecting a wavelength of radiation projected by each lens in the array of lenses.

5. The method of claim 1, wherein the array of lenses is an array of microlenses.

6. The method of claim 1, wherein the objective lens is a high numerical aperture lens.

7. The method of claim 6, wherein the numerical aperture of the objective lens is at least 0.9.

8. The method of claim 1, further comprising:
    generating a plurality of sub-images from the reflected radiation beam using the array of lenses; and
    determining a focal depth of particular points on the substrate based on a degree of variation amongst the sub-images generated by the array of lenses.

9. The method of claim 1, further comprising measuring the reflected radiation beam at a range of angles of a single wavelength.

10. The method of claim 1, further comprising detecting the angle resolved spectrum at multiple wavelengths in parallel using the detector.

11. The method of claim 1, wherein the angle resolved is a three dimensional spectrum that includes a wavelength measured at two different angles.

* * * * *